(12) United States Patent
Loboda

(10) Patent No.: US 6,268,262 B1
(45) Date of Patent: Jul. 31, 2001

(54) METHOD FOR FORMING AIR BRIDGES

(75) Inventor: Mark Jon Loboda, Midland, MI (US)

(73) Assignee: Dow Corning Corporation, Midland, MI (US)

(*) Notice: Subject to any disclaimer, the term of this patent is extended or adjusted under 35 U.S.C. 154(b) by 0 days.

(21) Appl. No.: 08/999,951

(22) Filed: Aug. 11, 1997

Related U.S. Application Data

(62) Division of application No. 08/547,074, filed on Oct. 23, 1995, now abandoned.

(51) Int. Cl.[7] .................................................. H01L 29/00
(52) U.S. Cl. ......................... 438/422; 438/421; 438/619; 438/411; 257/522
(58) Field of Search ..................................... 438/422, 619, 438/421, 412, 411, 931, 104, 53, 105; 257/522

(56) References Cited

U.S. PATENT DOCUMENTS

| | | | |
|---|---|---|---|
| 5,324,683 | 6/1994 | Fitch et al. .............................. | 437/65 |
| 5,354,695 | * 10/1994 | Leedy .................................... | 438/411 |
| 5,454,904 | * 10/1995 | Ghezzo et al. ......................... | 216/13 |
| 5,497,033 | * 3/1996 | Fillion et al. .......................... | 257/723 |
| 5,668,398 | * 9/1997 | Havemann et al. ................... | 257/522 |
| 5,674,758 | * 10/1997 | McCarthy .............................. | 438/26 |
| 6,109,106 | * 8/2000 | Ferrari et al. ...................... | 73/514.32 |

* cited by examiner

Primary Examiner—Eddie C. Lee
Assistant Examiner—Paul E Brock, II
(74) Attorney, Agent, or Firm—Sharon K. Severance

(57) ABSTRACT

Disclosed is a method for making an air bridge in an electronic device. This method uses amorphous silicon carbide to protect electrical conductors in the device during formation of the bridge. The silicon carbide also provides hermetic and physical protection to the device after formation.

11 Claims, 5 Drawing Sheets

METHOD FOR FORMING AIR BRIDGES

This application is a division of application Ser. No. 08/547,074 filed Oct. 23, 1995 which application is now abandoned.

BACKGROUND OF THE INVENTION

The present invention relates to a method of forming air bridges on electronic devices. The method uses amorphous silicon carbide to protect the conductors on the device during and after the air bridge formation.

The electronics industry continues to strive to decrease the size of devices. One of the difficulties in the process of miniaturization is maintaining a sufficient dielectric between conductors to prevent device failure.

To solve this problem, the industry has investigated a wide variety of low dielectric constant materials. These materials have shown to provide dielectric constants of about 2 and above. Unfortunately, many of these materials are difficult to process and their chemical and physical properties can be incompatible with the devices.

One of the best dielectrics available is simply air. Various investigators have attempted to capitalize on this by leaving voids between adjacent conductors. These voids are often called "air bridges". For instance, Fitch et al. in U.S. Pat. No. 5,324,683 describe the formation of an air bridge in an integrated circuit by removing all or a portion of a dielectric layer between conductors. The methods, materials and final product described therein, however, are different than those of the present invention.

The present invention has now discovered a method for forming an air bridge which uses the properties of silicon carbide in its formation and has the unexpected advantage of being more durable after formation.

BRIEF DESCRIPTION OF THE INVENTION

The present invention relates to a method for forming an air bridge on an electronic device. The method comprises first forming 2 separate conductors on an electronic device. These conductors have edges which are laterally adjacent to each other and the conductors are separated by a void. Next amorphous silicon carbide coatings are formed on the edges of the conductors which are laterally adjacent to each other such that the size of the void is decreased by the thickness of the coatings yet still leaving a void therebetween. Next, a sacrificial material is formed in the void between the laterally adjacent amorphous silicon carbide coated surfaces on the conductors. An amorphous silicon carbide coating is then formed on the sacrificial material. This coating is formed so that it contacts the amorphous silicon carbide coatings on the edges of the conductors and, thereby, encapsulates the sacrificial material in amorphous silicon carbide. The conductive bridge is then formed to electrically connect the conductors. This bridge is formed on the 2 conductors and the amorphous silicon carbide coating covering the sacrificial material. An amorphous silicon carbide coating is then deposited to cover the conductive bridge. Finally, the sacrificial material is etched to leave an air bridge between the silicon carbide on the conductors.

DETAILED DESCRIPTION OF THE INVENTION

The present invention is based on the discovery that the properties of amorphous silicon carbide (or "silicon carbide") can be used in the process of forming air bridges. This process provides a practical means for producing air bridges and, thereby, solves one of the problems involved in miniaturization. Additionally, the resultant air bridge is more durable than those known in the art since the conductors are protected and sealed by the amorphous silicon carbide coatings.

Figure 1:
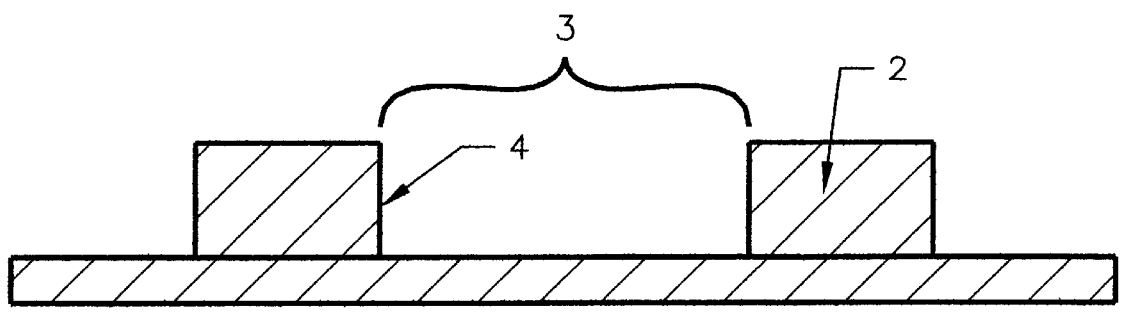
FIG. 1 is an electronic device having conductors thereon.

The first step in the present invention involves forming 2 separate electrical conductors ("conductors") on an electronic device. These conductors can be formed at any level within the device. An exemplary electronic device is shown in FIG. 1 as (1) and the conductors are shown as (2).

The electronic devices used herein is not critical and nearly any which are known in the art and/or produced commercially are useful herein. These can include, but are not limited to, silicon based devices, gallium arsenide based devices, focal plane arrays, opto-electronic devices, photovoltaic cells and optical devices.

The material used in making the conductor herein is not critical and nearly any which is known in the art and/or produced commercially is useful herein. These include, for example, metals such as aluminum, copper, gold, silver, platinum, etc., a silicide, polysilicon, amorphous silicon, a conductive organic material, a conductive inorganic material, etc.

Methods for depositing these conductors are also known in the art. The specific method utilized is again not critical. Examples of such processes include various physical vapor deposition (PVD) techniques such as sputtering and electron beam evaporation or various liquid deposition techniques.

As shown in FIG. 1, the conductors are formed on the device such that they are separated by void area (3). In addition, the conductors have edges (4) which are laterally adjacent to each other on the surface of the device.

Figure 3:
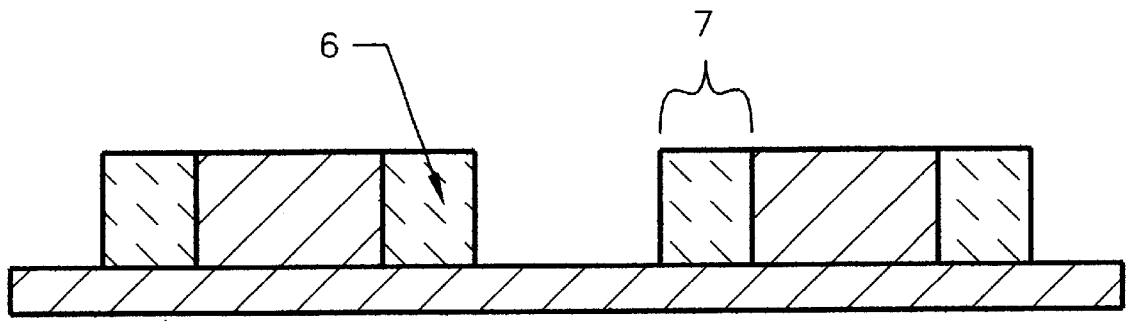
FIG. 3 is an electronic device of FIG. 2 wherein the silicon carbide is etched so that the edges of the conductors laterally adjacent to each other are coated with silicon carbide.

The next step in the invention involves forming amorphous silicon carbide coatings on the edges of the conductors (4) which are laterally adjacent to each other such that the size of the void (3) is decreased by the thickness of the coatings (7). These coatings are shown in FIG. 3 as (6).

Figure 2:
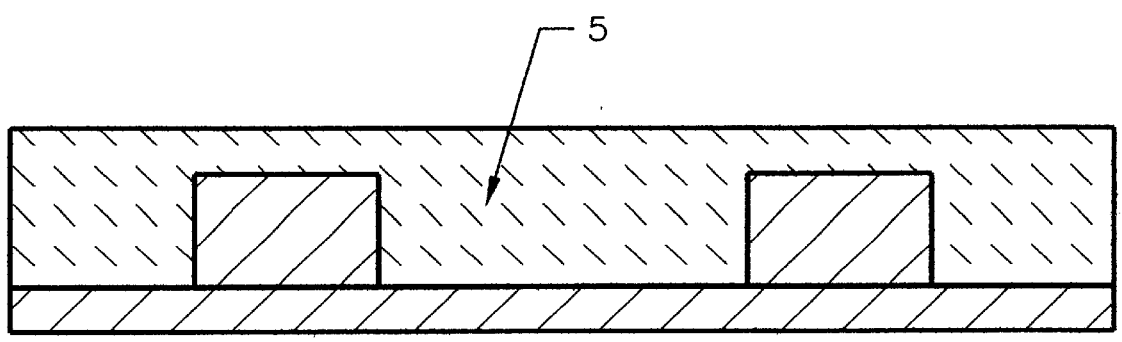
FIG. 2 is the electronic device of FIG. 1 coated with silicon carbide.

Generally, these coatings are formed on the conductors by a process which comprises depositing amorphous silicon carbide on the entire top surface of the device as shown by (5) in FIG. 2. This amorphous silicon carbide is then patterned and etched to leave coatings (6) on the conductor.

Other equivalent means such as patterned deposition, however, are also contemplated to be within the scope of the invention.

The method of applying the silicon carbide is not critical to the invention and many are known in the art. Examples of applicable methods include a variety of chemical vapor deposition techniques such as conventional CVD, photochemical vapor deposition, plasma enhanced chemical vapor deposition (PECVD), electron cyclotron resonance (ECR), jet vapor deposition, etc. and a variety of physical vapor deposition techniques such as sputtering, electron beam evaporation, etc. These processes involve either the addition of energy (in the form of heat, plasma, etc.) to a vaporized species to cause the desired reaction or the focusing of energy on a solid sample of the material to cause its deposition.

In conventional chemical vapor deposition, the coating is deposited by passing a stream of the desired precursor gases over a heated substrate. When the precursor gases contact the hot surface, they react and deposit the coating. Substrate temperatures in the range of about 100–1000° C. are sufficient to form these coatings in several minutes to several hours, depending on the precursors and the thickness of the coating desired. If desired, reactive metals can be used in such a process to facilitate deposition.

In PECVD, the desired precursor gases are reacted by passing them through a plasma field. The reactive species thereby formed are then focused at the substrate where they readily adhere. Generally, the advantage of this process over CVD is that lower substrate temperature can be used. For instance, substrate temperatures of about 50° C. up to about 600° C. are functional.

The plasma used in such processes can comprise energy derived from a variety of sources such as electric discharges, electromagnetic fields in the radio-frequency or microwave range, lasers or particle beams. Generally preferred in most plasma deposition processes is the use of radio frequency (10 kHz $-10^2$ MHz) or microwave (0.1–10 GHz) energy at moderate power densities 0.1–5 watts/cm$^-$). The specific frequency, power and pressure, however, are generally tailored to the precursor gases and the equipment used.

The precursor gases are also not critical to the invention. Examples of suitable precursor gases include (1) mixtures of silane or a halosilane such as trichlorosilane in the presence of an alkane of one to six carbon atoms such as methane, ethane, propane, etc.; (2) an alkylsilane such as methylsilane, dimethylsilane, trimethylsilane and hexamethyldisilane; or (3) a silacyclobutane or disilacyclobutane as further described in U.S. Pat. No. 5,011,706, which is incorporated herein in its entirety. Especially preferred in the present invention is the plasma enhanced chemical vapor deposition of trimethylsilane.

Likewise, the method of etching is not critical and nearly any process known in the art will function herein. These include, for example, dry etching (eg., with plasma), wet etching (eg., with aqueous hydrofluoric acid) and/or laser ablation.

Figure 4:
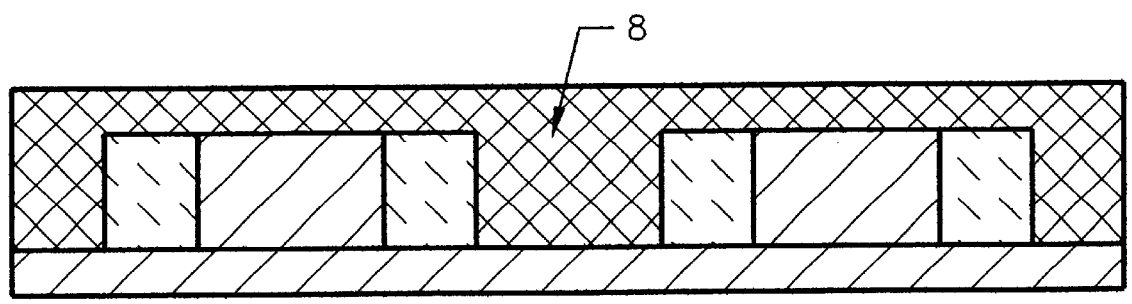
FIG. 4 is the electronic device of FIG. 3 coated with a sacrificial material.
Figure 5:
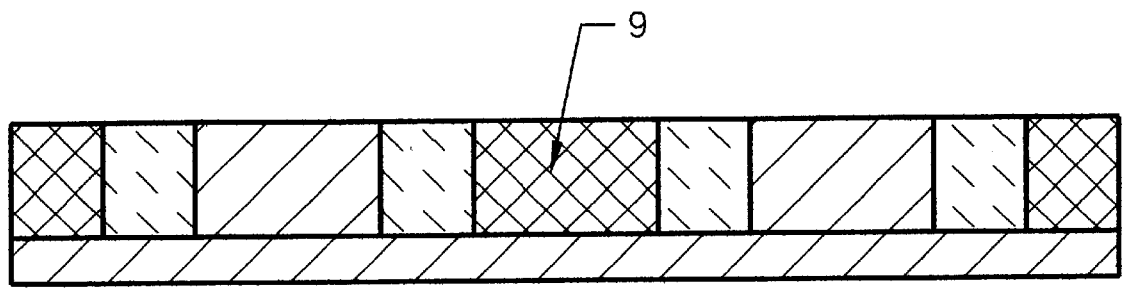
FIG. 5 is the electronic device of FIG. 4 wherein the sacrificial material is patterned to fill the void between the coated conductors.

Next, sacrificial material is deposited in the void between the adjacent amorphous silicon carbide coated surfaces on the conductors. This is shown in FIG. 5 as material (9). This material is also generally formed by a process which comprises depositing the sacrificial material on the entire top surface of the device as shown by (8) in FIG. 4. This sacrificial material is then patterned and etched to leave material (9) in the void. Other equivalent means such as patterned deposition, however, are also contemplated to be within the scope of the invention.

The sacrificial material used herein is not critical as long as it can be etched without etching or damaging the electronic device, the conductors or the silicon carbide. These materials can include, for example, oxides, nitrides, fluorinated materials, organic materials, polymeric materials, and the like. Specific examples include silicon dioxide, silicon nitride, titanium nitride, borosilicate glass, polyimide and the like. Preferred is silica derived from hydrogen silsesquioxane resin can be applied by a process such as that described in U.S. Pat No. 4,756,977, which is incorporated herein by reference.

The sacrificial materials are applied by techniques known in the art for the material chose. Such techniques can include, for example, spin-on processes, chemical vapor deposition, plasma enhanced chemical vapor deposition, sputtering and the like.

Again, if the material is to be patterned and etched, it is performed by techniques known in the art. As before, they can include, for example, dry etching (eg., with plasma), wet etching (eg., with aqueous hydrofluoric acid) and/or laser ablation.

Figure 7:
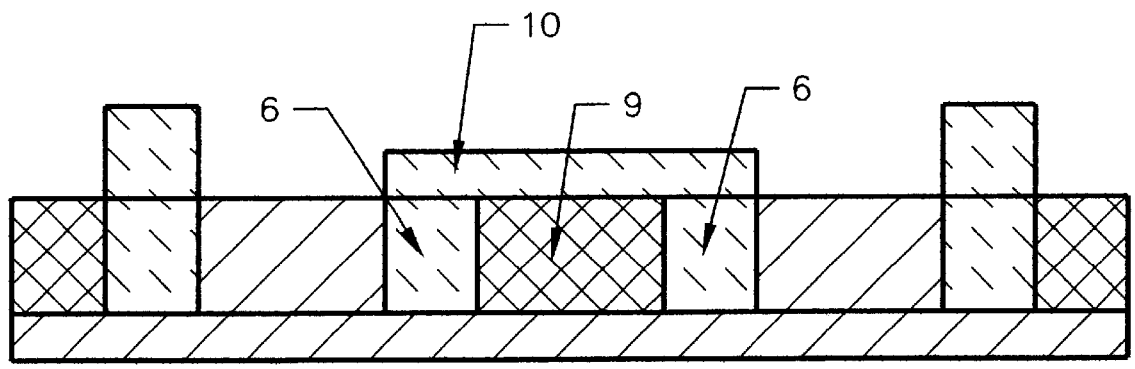
FIG. 7 is the electronic device of FIG. 6 wherein the silicon carbide is patterned.

An amorphous silicon carbide coating is then deposited on the sacrificial material. This coating is deposited so that is contacts the amorphous silicon carbide coatings on the edges of the conductors and, thereby, encapsulates the sacrificial material. This is shown in FIG. 7 wherein silicon carbide layer (11) is deposited on sacrificial material (9) and contacts the coatings (6) on the conductors.

Figure 6:
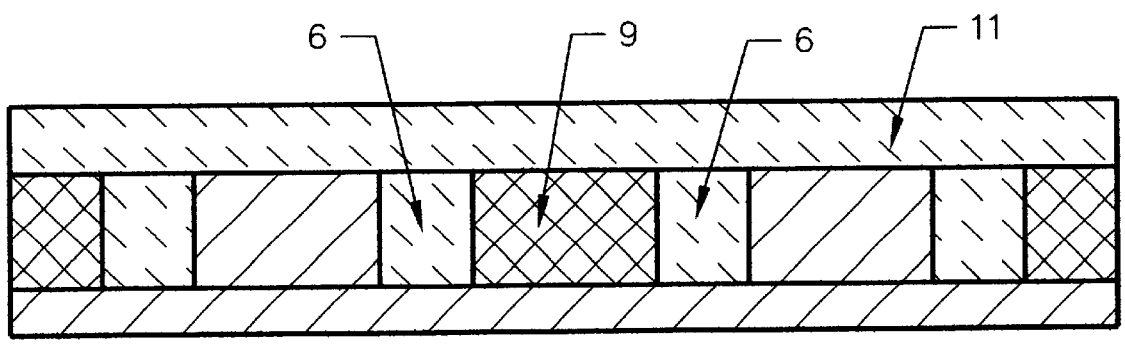
FIG. 6 is the electronic device of FIG. 5 coated with silicon carbide.

Generally, these coatings are formed by a process which comprises depositing amorphous silicon carbide on the entire top surface of the device as shown by (11) in FIG. 6. This amorphous silicon carbide is then patterned and etched to leave coatings (10) on the sacrificial material. Other equivalent means such as patterned deposition, however, are also contemplated to be within the scope of the invention. The materials and methods for depositing and etching the coating on the sacrificial material are not critical and many are known in the art. Generally, these are the same as those described above for forming the previous silicon carbide coating.

Figure 8:
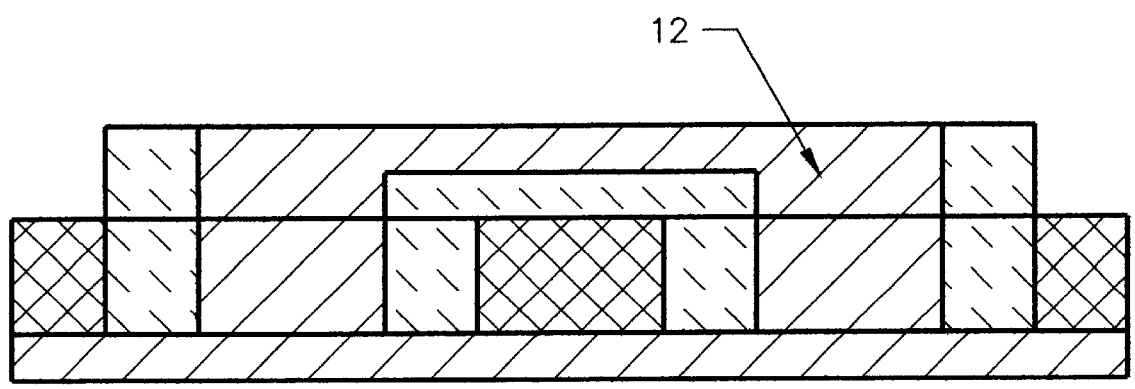
FIG. 8 is the electronic device of FIG. 7 wherein a conductive bridge is formed.

Next, a conductive bridge which electrically connects the conductors is formed. As shown in FIG. 8, this bridge (12) is formed on the 2 conductors (2) and the amorphous silicon carbide coating covering the sacrificial material (10). The materials and methods for forming this bridge are known in the art and are generally the same as those described above used in forming the conductors.

Figure 9:
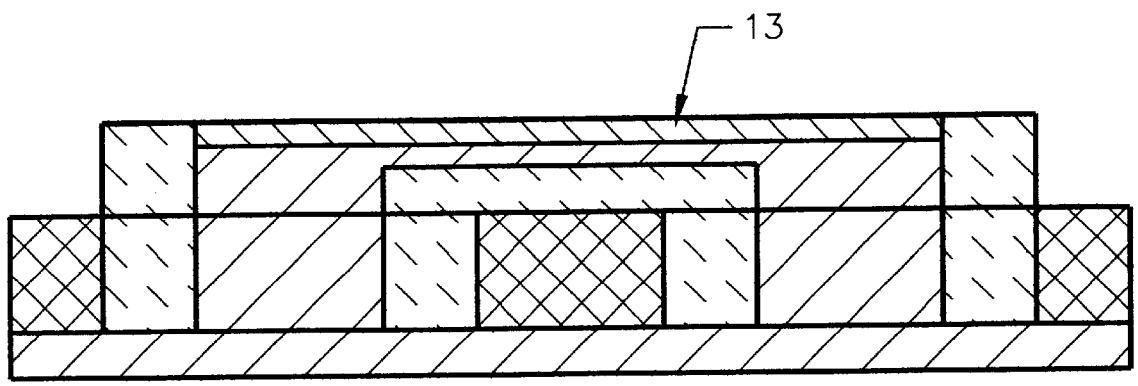
FIG. 9 is the electronic device of FIG. 8 coated with silicon carbide.

Amorphous silicon carbide is then deposited to coat the conductive bridge. This is shown in FIG. 9 as coating (13). This, again, can be done by selective deposition or by deposition and etching. The materials and methods for depositing and etching the coating on the conductive bridge are not critical and many are known in the art. Generally, these are the same as those described above for forming the previous silicon carbide coating.

Figure 10:
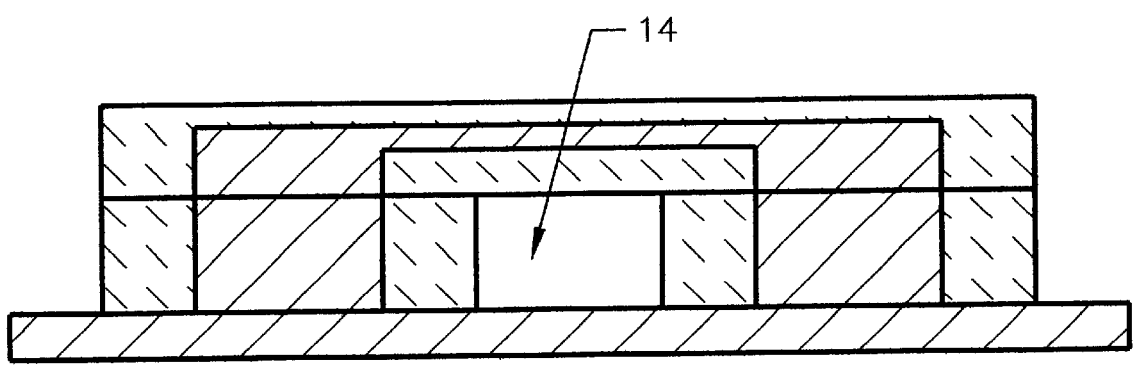
FIG. 10 is the electronic device of FIG. 9 wherein the sacrificial material is removed.

Finally, the sacrificial material is etched to leave the air bridge. This is shown in FIG. 10 as void (14). The method of etching, again, is not critical and any known in the art can be used as long as the etching can be limited to the sacrificial material. These include, for example, dry etching (eg., with plasma), wet etching (eg., with aqueous hydrofluoric acid) and/or laser ablation.

The resultant device has the desired air bridge as shown in FIG. 10. In addition, however, the air bridge of the present invention has silicon carbide protecting the conductors. This provides both a hermetic barrier to inhibit degradation caused by corrosion as well as a physical barrier to prevents shorting which may be result if the bridge was physically altered.

That which is claimed is:

1. A method for forming air bridges on an electronic device comprising:

forming a first conductor and a separate second conductor on an electronic device, said conductors having edges which are laterally adjacent to each other and separated by a void;

forming a first amorphous silicon carbide coating on the edges of the conductors which are laterally adjacent to each other such that a void remains but the size of the void is decreased by the thickness of the coatings;

depositing a sacrificial material in the void between the laterally adjacent amorphous silicon carbide coated edges of the conductors;

depositing a second amorphous silicon carbide coating to cover the sacrificial material, said coating contacting the amorphous silicon carbide coatings on the edges of the conductors to encapsulate the sacrificial material;

depositing a conductive bridge which electrically connects the first and second conductors, said bridge being deposited on the first and second conductors and the amorphous silicon carbide coating covering the sacrificial material;

depositing a third amorphous silicon carbide coating to cover the conductive bridge; and etching the sacrificial material to leave the air bridge.

2. The method of claim 1 wherein the electronic device is selected from the group consisting of silicon based devices, gallium arsenide based devices, focal plane arrays, optoelectronic devices, photovoltaic cells and optical devices.

3. The method of claim 1 wherein each conductor is made from a material selected from the group consisting of aluminum, copper, gold, silver, platinum, a silicide, polysilicon, amorphous silicon, a conductive organic material and a conductive inorganic material.

4. The method of claim 3 wherein each conductor is deposited by a processes selected from the group consisting of physical vapor deposition and liquid deposition.

5. The method of claim 1 wherein the first amorphous silicon carbide coatings are formed by the plasma enhanced chemical vapor deposition of trimethylsilane.

6. The method of claim 1 wherein the sacrificial material is silica derived from hydrogen silsesquioxane resin.

7. The method of claim 1 wherein the second amorphous silicon carbide coating is formed by the plasma enhanced chemical vapor deposition of trimethylsilane.

8. The method of claim 1 wherein the conductive bridge is made from a material selected from the group consisting of aluminum, copper, gold, silver, platinum, a silicide, polysilicon, amorphous silicon, a conductive organic material and a conductive inorganic material.

9. The method of claim 8 wherein the conductive bridge is deposited by a processes selected from the group consisting of physical vapor deposition and liquid deposition.

10. The method of claim 1 wherein the third amorphous silicon carbide coating is formed by the plasma enhanced chemical vapor deposition of trimethylsilane.

11. The method of claim 1 wherein the sacrificial material is etched by a process selected from the group consisting of dry etching, wet etching and laser ablation.

* * * * *